(12) United States Patent
Pirillis (10) Patent No.: US 7,914,317 B2
(45) Date of Patent: Mar. 29, 2011

(54) REVERSE CAM RELEASE MECHANISM

(75) Inventor: Alexandros Pirillis, Skokie, IL (US)

(73) Assignee: Methode Electronics, Inc., Chicago, IL (US)

( * ) Notice: Subject to any disclaimer, the term of this patent is extended or adjusted under 35 U.S.C. 154(b) by 726 days.

(21) Appl. No.: 11/895,373

(22) Filed: Aug. 24, 2007

(65) Prior Publication Data
US 2009/0051175 A1 Feb. 26, 2009

(51) Int. Cl.
*H01R 13/62* (2006.01)
(52) U.S. Cl. ...................................... 439/372
(58) Field of Classification Search .......... 439/347, 439/372, 327; 361/726
See application file for complete search history.

(56) References Cited

U.S. PATENT DOCUMENTS

| | | | |
|---|---|---|---|
| 2,793,927 A | 5/1957 | Reitzel | |
| 3,145,441 A | 8/1964 | Strandrud | |
| 3,218,112 A | 11/1965 | Stark | |
| 3,377,116 A | 4/1968 | Dalbey | |
| 5,510,957 A | 4/1996 | Takagi | |
| 5,734,558 A | 3/1998 | Poplawski et al. | |
| 6,543,866 B2 | 4/2003 | Chen et al. | |
| 6,793,517 B2* | 9/2004 | Neer et al. | 439/372 |
| 6,890,206 B2 | 5/2005 | Distad et al. | |
| 6,921,227 B1 | 7/2005 | De Jong et al. | |
| 6,935,882 B2 | 8/2005 | Hanley et al. | |
| 6,991,481 B1 | 1/2006 | Guan et al. | |
| 7,066,746 B1 | 6/2006 | Togami et al. | |
| 7,066,762 B2 | 6/2006 | Neer et al. | |
| 7,077,686 B2 | 7/2006 | Seo et al. | |
| 7,101,093 B2 | 9/2006 | Hsiao et al. | |
| 7,114,984 B2 | 10/2006 | Shirk et al. | |
| 7,175,470 B2 | 2/2007 | Kangas | |
| 7,380,995 B2* | 6/2008 | Chan | 385/92 |
| 7,484,987 B2* | 2/2009 | Ice | 439/350 |
| 2004/0066632 A1 | 4/2004 | Fang | |
| 2004/0110406 A1 | 6/2004 | Phillips et al. | |
| 2005/0048831 A1* | 3/2005 | Neer et al. | 439/372 |
| 2005/0157474 A1 | 7/2005 | Larson | |
| 2005/0282425 A1 | 12/2005 | Lloyd et al. | |
| 2006/0023434 A1 | 2/2006 | Andrei et al. | |
| 2006/0246766 A1 | 11/2006 | Neer et al. | |
| 2006/0273599 A1 | 12/2006 | Kangas | |
| 2007/0008708 A1 | 1/2007 | Hanning et al. | |

OTHER PUBLICATIONS

X2 MSA Document: "A Cooperation Agreement for a Small Versatile 10 Gigabit Transceiver Package," Issue 2.0b; Apr. 7, 2005; Website: x2msa.org.

\* cited by examiner

*Primary Examiner* — Phuong K Dinh
(74) *Attorney, Agent, or Firm* — Greenberg Traurig LLP (57) ABSTRACT

A releasable locking mechanism is provided that includes a carrier, at least one projection and an actuator. The projection extends from the carrier and is rotatable along a rotational axis between a locked state and an unlocked state. The actuator is operably coupled to the projection and is movable along a first axis between a first position and a second position whereby in the first position the projection is rotated to the locked state and in the second position the projection is rotated to the unlocked state, the first axis being substantially perpendicular with the rotational axis.

25 Claims, 7 Drawing Sheets

REVERSE CAM RELEASE MECHANISM

FIELD OF THE INVENTION

The invention relates generally to a locking mechanism, and in more particular applications to a locking mechanism for maintaining a carrier within a receptacle.

BACKGROUND

Locking mechanisms can be utilized to secure a variety of carriers within receptacles. For example, a carrier such as an electronic module can be inserted and secured within a base device, such as a computer. Oftentimes it is desirable to have the module secured, yet also be removable so that replacement and/or upgrade modules can be inserted into the base device. For example, in one form the module is a copper transceiver module and the base is a router for routing data packets. In this form it may be desirable to later upgrade the copper module with a fiber optic module without having to replace the entire router.

Oftentimes the carrier and receptacle are designed to be compact structures and therefore it may be desirable to have the locking mechanism also be compact to minimize overall space. For example, electronics are generally becoming more compact and therefore, locking structures must also be miniaturized.

Furthermore, it is often desirable to easily remove the carrier from the receptacle. However, the carrier should be secured such that accidental contact does not unlock and/or remove the carrier from the receptacle.

It is known to utilize an actuating member to retract biased projections back into the carrier such that the carrier can be removed from the receptacle. However, these devices can be complex. Furthermore, these devices oftentimes require additional force to retract the projections as they may get caught on the receptacle as they are retracted into the carrier.

In order to provide such features, the locking mechanism of the present invention is provided that overcomes the disadvantages of the prior art.

SUMMARY

In one form, a releasable locking mechanism is provided. The mechanism includes a carrier, at least one projection and an actuator. The at least one projection extends from the carrier and is rotatable about a rotational axis between a locked state and an unlocked state. The actuator is operably coupled to the at least one projection and is movable along a first plane between a first position and a second position whereby in the first position the at least one projection is rotated to the locked state and in the second position the at least one projection is rotated to the unlocked state.

According to one form, a releasable locking mechanism and assembly are provided. The mechanism includes a carrier, a receptacle, an engagement surface and at least one projection. The receptacle is sized to receive at least a portion of the carrier. The engagement surface is located on one of the carrier and the receptacle. The at least one projection extends from the other of the carrier and the receptacle. The at least one projection has an engagement face and a sliding face. The engagement face engages the engagement surface in a locked state thereby retaining the carrier relative to the receptacle. The sliding face engages the engagement surface in an unlocked state thereby permitting the carrier to be removed from the receptacle. The at least one projection is rotatable between the locked state and the unlocked state.

In one form, a releasable fastener and assembly are provided. The mechanism includes a carrier, a receptacle, an engagement surface, at least one projection and an actuator. The receptacle is sized to receive at least a portion of the carrier. The engagement surface is located on one of the carrier and the receptacle. The at least one projection extends from the other of the carrier and the receptacle. The at least one projection is rotatable about a rotational axis between a locked state thereby retaining the carrier relative to the receptacle and an unlocked state thereby permitting the carrier to be removed from the receptacle. The actuator is operably coupled to the at least one projection and is movable along a first plane between a first position and a second position, whereby in the first position the at least one projection is rotated to the locked state and in the second position the at least one projection is rotated to the unlocked state. The first plane being substantially parallel with the rotational axis.

In one form, the first plane is substantially parallel with the first axis.

According to one form, the at least one projection includes an engagement face and a sliding face.

In one form, the engagement face is oriented at a terminal end of the projection adjacent the sliding face and the engagement face is offset from the sliding face by approximately 90°.

According to one form, the at least one projection extends along a longitudinal axis. The engagement face is parallel to the longitudinal axis and the sliding face is skewed from the longitudinal axis.

In one form, the carrier includes an exterior surface such that the at least one projection can extend from the exterior surface and retract at least partially within the exterior surface.

According to one form, the at least one projection can rotate between a locked state and an unlocked state and through an intermediate state. The at least one projection is capable of retracting at least partially within the exterior surface in the locked and unlocked states and cannot be retracted in the intermediate state.

In one form, the at least one projection includes a retraction lock to prevent the projection from retracting within the exterior surface while in the intermediate state.

According to one form, the releasable locking mechanism further includes two projections, each biased towards the locked state.

In one form, the at least one projection includes a tab extending therefrom and the actuator includes an aperture operably coupled to the tab to rotate the at least one projection.

According to one form, a method of removing a carrier from a receptacle is provided. The method includes the steps of: manipulating an actuator in a first direction along a first axis; rotating a projection operably coupled to the actuator about a rotational axis which is substantially perpendicular to the first axis; manipulating the carrier in the first direction; and retracting the projection, at least partially, such that the projection disengages an engagement surface, whereby the carrier can be removed from the receptacle.

In one form, the step of rotating the projection includes rotating the projection about the rotational axis approximately 90°.

Other forms are also contemplated as understood by those skilled in the art.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its constructions and operation, and many of its advantages should be readily understood and appreciated.

DETAILED DESCRIPTION

Figure 1:
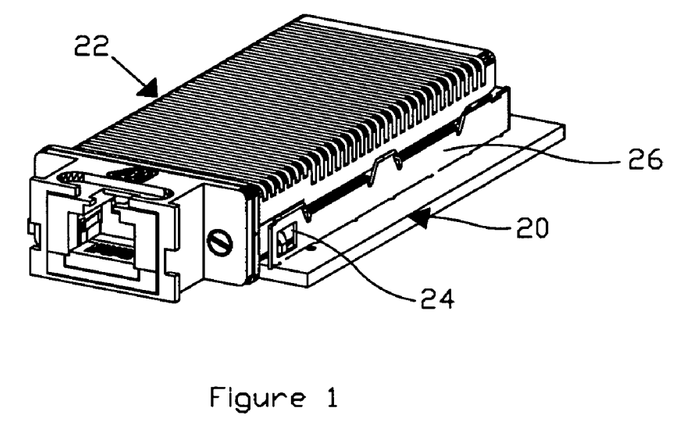
FIG. 1 is a perspective view of one form of a carrier locked into place within a receptacle.
Figure 2:
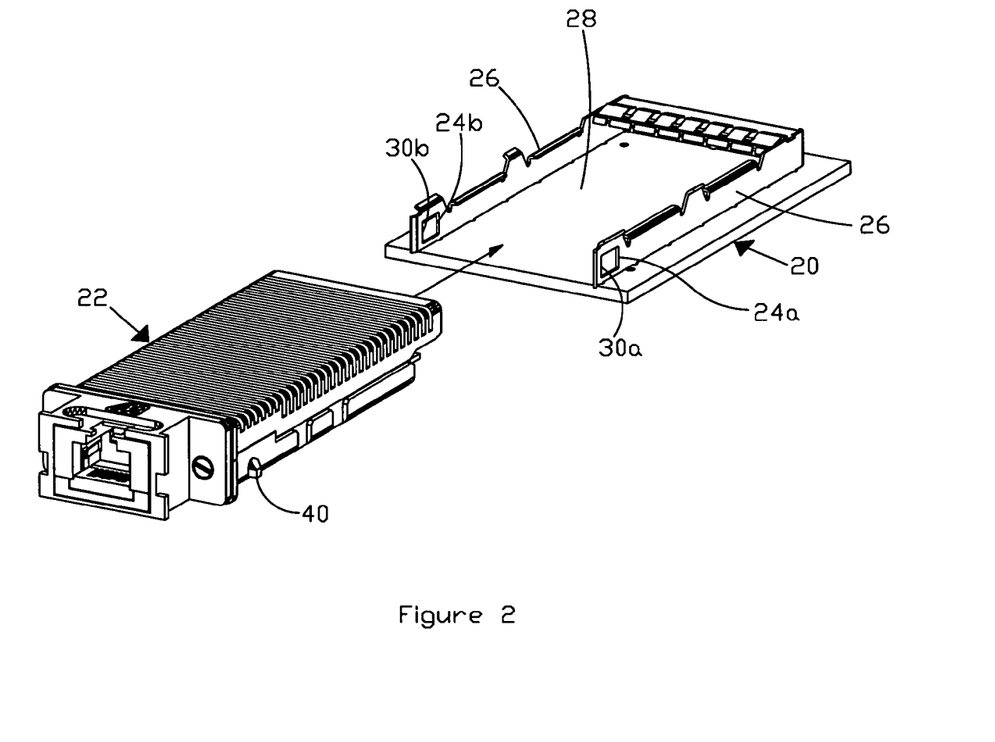
FIG. 2 is perspective view of the carrier prior to being inserted into the receptacle of FIG. 1.

An embodiment of the present invention is illustrated in FIGS. 1-7. As illustrated in FIG. 1, a receptacle 20 is shown in locking engagement with a carrier 22. As shown, the receptacle 20 is sized to receive at least a portion of the carrier 22. In one form, as illustrated in FIGS. 1 and 2, the receptacle includes multiple apertures 24a,b. It should be understood that the receptacle 20 may have additional apertures 24a,b or as few as a single aperture 24a,b. Furthermore, the apertures 24a,b may be located in a variety of positions on the receptacle 20. For example, as seen in FIG. 2, the apertures 24a,b are located on side walls 26. However, the apertures 24a,b may also be located elsewhere, such as on bottom wall (motherboard) 28.

In one form, the apertures 24a,b include an engagement surface 30a,b, the function of which will be described below as it relates to the carrier 22. It should be understood that in an alternative embodiment the engagement surface 30a,b need not be a part of the aperture 24a,b. Instead, the engagement surface 30a,b may simply be a surface extending along a portion of the receptacle 20 or may be disposed on the carrier 22.

Figure 3:
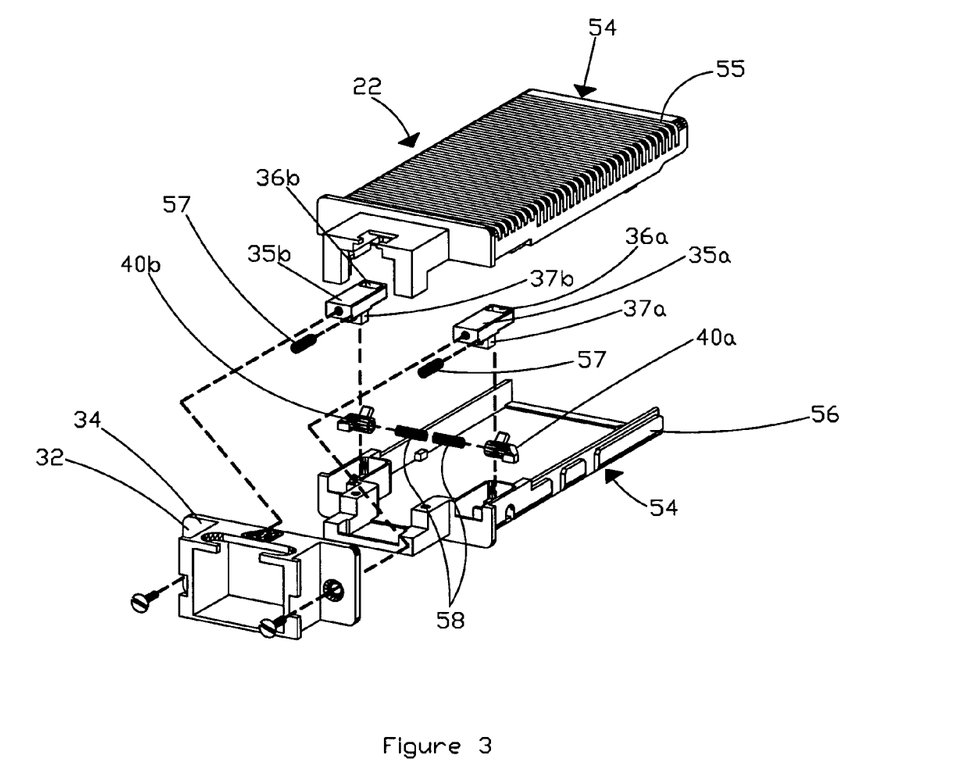
FIG. 3 is an exploded view of one form of a carrier of FIG. 1.

The receptacle 20 may take a variety of forms as understood by those skilled in the art. For example, the receptacle 20 may take the form of a rail or cage. Furthermore, the receptacle 20 may form a completely enclosed structure. The receptacle 20 may also include other structure (not shown) such as electrical contacts, faraday cages, heat sinks, structure to secure the receptacle 20 to a larger component as well as other structure understood by those skilled in the art. The receptacle 20 and carrier 22 as depicted in FIGS. 1-3 are an X2 transceiver as described in the X2 MSA Issue 2.0b, Apr. 7, 2005, incorporated herein by reference. The X2 MSA is posted on internet site: x2 msa.org. However, it is to be understood that the locking mechanism of the preset invention may be applicable to any other type of receptacle or carrier.

Figure 4:
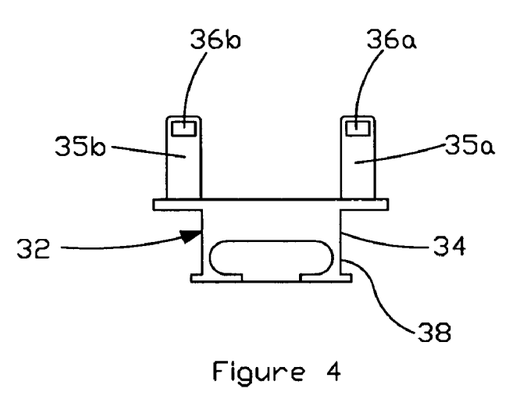
FIG. 4 is a top view of an actuator.

The carrier 22 includes an actuator 32. As best seen in FIGS. 3 and 4, in one form, the actuator 32 takes the form of a sleeve 34. In one form, the actuator 32 includes extended portions 35a,b having apertures 36a,b and stop tabs 37a,b. The actuator 32 may also include a gripping portion 38.

Figure 5A:
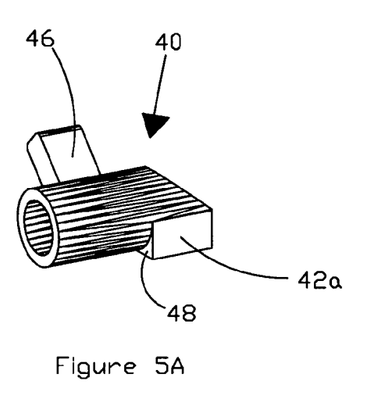
FIGS. 5A-D are perspective views of one form of a projection.
Figure 5B:
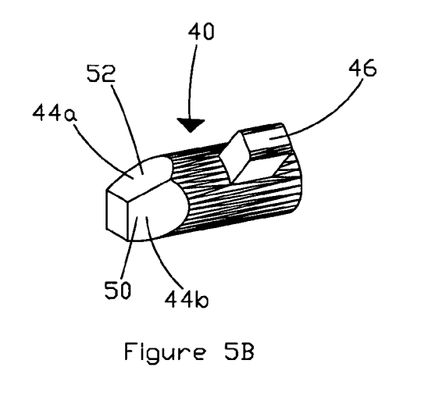
Figure 5C:
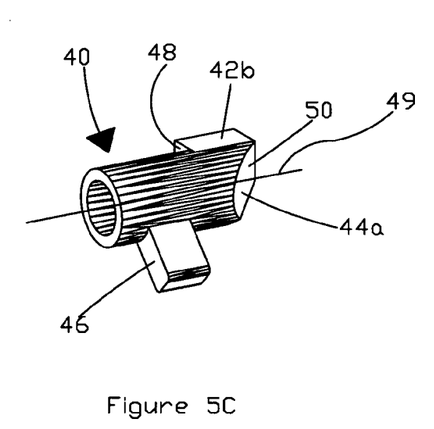
Figure 5D:
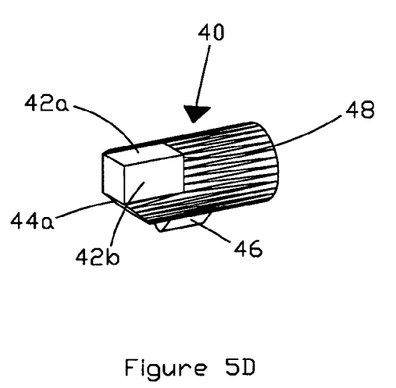

Projections 40a,b are disposed adjacent the carrier 22. The projections 40a,b are actuated by the actuator 32 as will be discussed in more detail below. The operation of the projections 40a,b with respect to the receptacle 20 will also be discussed in more detail below. Referring to FIGS. 5A-D, each of the projections 40a,b includes at least one engagement face 42a,b, at least one sliding face 44a,b, a tab 46 and a retraction lock face 48. In one form, the engagement face 42a,b is oriented approximately 90° from the sliding face 44a,b. In one form, the projection extends along a longitudinal axis 49. In this form, the engagement face 42a,b extends parallel to the axis 49 and the sliding face 44a,b is skewed from the axis 49, as shown in FIG. 5C. The faces 42a,b, 44a,b may take a variety of forms, including flat faces, curved faces and other forms of faces as understood by those skilled in the art. Furthermore, each of the multiple engagement faces 42a,b and sliding faces 44a,b may instead take the form of a single larger surface (not shown).

In an embodiment, the projection 40a,b includes multiple sliding faces 44a,b, an insertion sliding face 50 and a removal sliding face 52. The function of these faces will be described below. However, as described above, the insertion sliding face 50 and the removal sliding face may take the form of a single face 44. It should be noted that depending on the location of the projection 40a,b, such as on the right or left side of the carrier 22, the location of the respective insertion and removal engagement faces 50,52 may be switched.

In one form, as illustrated in FIGS. 5A-D, the projection 40 is substantially cylindrically shaped. In this form, the engagement face 42a,b and retraction lock face 48 form a common structure extending from the cylindrical shape. It should be noted that the projection 40 may also take other shapes understood by those skilled in the art. Similarly, the engagement face 42a,b and retraction lock face 48 may also take other forms and shapes.

While illustrated as having two projections 40a,b, it should be understood that the carrier 22 can include any number of projections 40a,b, and as few as a single projection 40. Furthermore, while illustrated in the figures as having the projections 40a,b on the carrier 22 and the engagement surface 30a,b on the receptacle 20, it should be understood that the projection 40a,b may instead be located on the receptacle 20 and the engagement surface 30a,b located on the carrier 22. Additionally, in another form, each of the receptacle 20 and the carrier 22 may include a projection 40a,b and an engagement surface 30a,b.

Referring to FIG. 3, the carrier 22 may also include additional structures such as an exterior surface or housing 54. In one form, the housing 54 includes an upper portion 55 and a lower portion 56. While shown as including two portions 55,56, the housing 54 can include any number of components as understood by those skilled in the art. Furthermore, the housing 54 need not form a complete enclosure and, for example, provide a faraday cage. Similarly, the carrier 22 need not form a housing 54 at all, but instead may simply include a platform for mounting the respective components of the locking mechanism.

The carrier 22 may also include other structures such as bias members or springs 57,58. The springs 57,58 can be used to bias various structures. For example, the springs 57 can be used to bias the actuator 32 such that it remains abutting the carrier 22 unless pulled away from the carrier 22. Similarly, the springs 58 can be used to bias the projections 40a,b such that they extend from the carrier 22. It should be understood that other structures may be used to bias the actuator 32 and projections 40a,b as understood by those skilled in the art.

Additionally, the carrier 22 can include even further structure, such as screws, fasteners and other structures as understood by those skilled in the art. Furthermore, in one form, the carrier 22 is a module for containing electronic components such as capacitors, resistors, ICs, or printed circuit boards (not shown). In this form, the carrier 22 might also include electrical contacts or electrical connectors (not shown) for cooperating with the receptacle 20 and mating the carrier 22 to the receptacle 20. Additional structure such as optical subassemblies and laser and photo diodes are also contemplated as understood by those skilled in the art.

Figure 6:
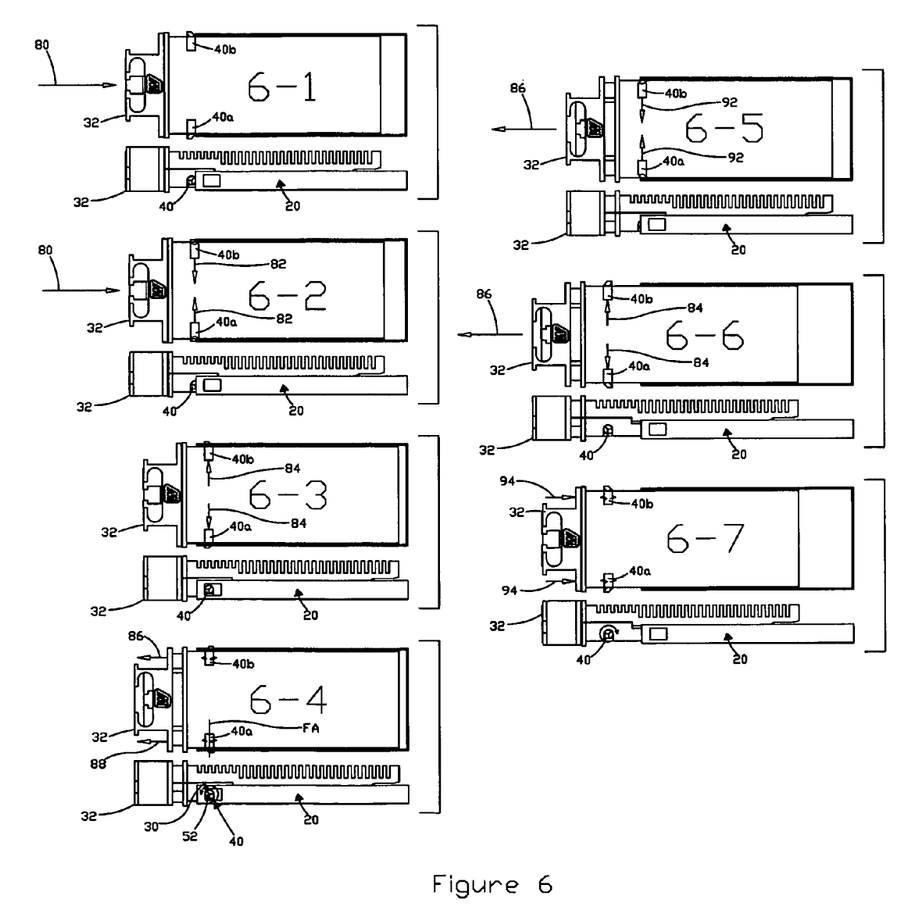
FIG. 6 is a diagrammatic representation of the relative orientation of the carrier of FIG. 1 as it is inserted, locked, unlocked and removed from a receptacle.
Figure 7A:
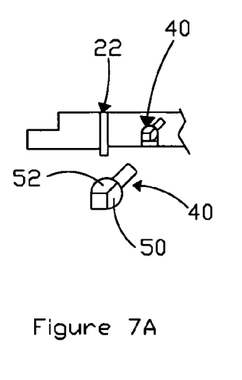
FIGS. 7A-C are side views of a receptacle and projection as it rotates from a locked state through an intermediate state to an unlocked state.

The operation and relative motion of the structures discussed above will now be described in detail with reference to FIGS. 6 and 7A-C. Referring to FIG. 6 and orientation 6-1, the carrier 22 is being inserted into the receptacle 20 in a direction indicated by arrow 80. As seen in orientation 6-1, the projections 40a,b are biased such that they extend from the carrier 22. The projections 40a,b are in a locked state having a rotational orientation as shown in FIG. 7A. Furthermore, the actuator 32 is in a first or locked position, as shown in orientation 6-1.

Referring to orientation 6-2 which illustrates the carrier 22 inserted further into the receptacle 20, the projections 40a,b, and more particularly the insertion sliding surface 50, contacts the receptacle 20 thereby causing the projections 40a,b to retract, at least partially, within the carrier 22 as indicated by arrows 82. It should be noted that the projections 40a,b still have the same rotational orientation as shown in FIG. 7A, such that they are in the locked state.

The carrier 22 is shown completely inserted into the receptacle 20, as in orientation 6-3. Once the carrier 22 is fully inserted into the receptacle 20, the projections 40a,b are permitted to once again extend from the carrier 22 as a result of a biasing force, indicated by arrows 84, such as provided by springs 58. The projections 40a,b are still in the locked state as shown in FIG. 7A. In this orientation, the engagement face 42a,b of the projection 40 is adjacent to and/or contacts the engagement surface 30a,b of the receptacle 20. In this manner, the carrier 22 is prevented from being inadvertently removed from the receptacle 20. In one form, the engagement face 42a,b extends substantially parallel to the engagement surface 30a,b. Due to friction and the respective orientations of the face 42a,b and the surface 30a,b, the projections 40a,b are prevented from retracting within the carrier 22 and therefore, the carrier 22 will be retained and not be inadvertently removed from the receptacle 20.

Figure 7B:
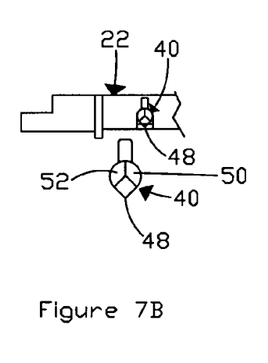
Figure 7C:
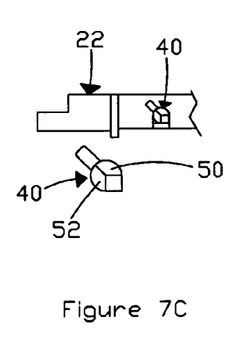

Once it is desired to remove the carrier 22 from the receptacle 20, an operator can manipulate the actuator 32, such as by moving the actuator 32 along a direction indicated by arrow 86 along an axis indicated by arrow 88, as illustrated in orientation 6-4. The direction 86 may lie along a first plane. In this form, the actuator 32 can manipulate the projections 40a,b. Specifically, the apertures 36a,b are operably coupled to the tabs 46, such as shown in FIG. 3. Therefore, the lateral motion of the actuator 32 is translated into rotational motion of the projections 40a,b. The actuator 32 can be utilized to rotate the projections 40a,b from the locked state, through an intermediate state to an unlocked state. These states are represented in FIGS. 7A-C respectively. FIGS. 7A-C depict a side view of the projections 40a,b extending into the receptacle 20 as well as an enlarged view of the projections 40a,b to more clearly illustrate the orientation of the projections 40a,b.

The locked state has already been described above where the insertion sliding face 50 contacts the receptacle 20. Alternatively, the engagement face 42a,b is adjacent to and/or contacts the engagement surface 30a,b. Once the projection 40 begins rotation from the locked state, it enters the intermediate state, such as shown in FIG. 7B. In this state, the projection 40 cannot be retracted into the carrier 22 due to the contact of the retraction lock face 48 and the receptacle 20. The unlocked state is illustrated in FIG. 7C. In this state, the projection 40 can once again be permitted to retract within the carrier 22.

Referring to orientation 6-4, the projections 40a,b are rotated about rotational axis FA which is substantially perpendicular to the axis 88. The actuator 32 is manipulated from the locked position to a second or unlocked position whereby the projections 40a,b are in the unlocked state. In one form, the projections 40a,b are rotated approximately 90° such that the removal sliding face 52 is adjacent the engagement surface 32.

Once in the unlocked state, the projections 40a,b are forced inwardly (retracted), as illustrated by arrows 92 in orientation 6-5. The projections 40a,b are forced inwardly as a result of the removal sliding face 52 contacting the engagement surface 30a,b and/or another portion of the receptacle 20. Furthermore, the shape and orientation of the removal sliding face 52 helps the projections 40a,b retract. Specifically, the shape of removal sliding face 52 can be angled, curved, arced or other shapes which may help the removal sliding face slide against the engagement surface 30a,b. Furthermore, the removal sliding face 52 can be oriented to minimize friction against the engagement surface 30a,b, such as by having the removal sliding face 52 angled with respect to the engagement surface 30a,b.

As illustrated in orientation 6-6, once the projections 40a,b are free from contacting the receptacle 20, they can again extend from the carrier 22 due to the biasing force, illustrated by arrows 84. In this orientation, the projections 40a,b are still maintained in the unlocked state as the actuator 32 is still being manipulated.

Referring now to orientation 6-7, the actuator 32 is released whereby the actuator returns to the locked position as a result of a biasing force, illustrated by arrows 94. Therefore, as the actuator returns to the locked position, the projections 40a,b return to the locked state, such as illustrated in FIG. 7A.

It should be noted that in the locked and unlocked states, the projections 40a,b are permitted to retract within the carrier 22. However, in the intermediate state, the projections 40a,b are not permitted to retract within the carrier 22, due to the contact of the retraction lock face 48 and the receptacle 20. It should be noted that the retraction lock face 48 may be omitted to permit the projections 40a,b to retract prior to being completely rotated to either of the locked or unlocked states.

The various components and structures described herein may be made from a variety of materials including metals, polymers, plastics and the like. Furthermore, the structures may include a combination of metals, polymers, plastics and the like as understood by those skilled in the art.

The matter set forth in the foregoing description and accompanying drawings is offered by way of illustration only and not as a limitation. While particular embodiments have been shown and described, it will be obvious to those skilled in the art that changes and modifications may be made without departing from the broader aspects of applicants' contribution. For example, covering components, other than a heat sink and cages other than transceiver receptacles may be shielded by the gasket of the present invention. The actual scope of the protection sought is intended to be defined in the following claims when viewed in their proper perspective based on the prior art.

The invention claimed is:

1. A releasable locking mechanism comprising:
   a carrier;
   at least one projection extending from the carrier, the at least one projection having a face formed at its terminal end and the projection being rotatable along a rotational axis between a locked state, wherein the face is rotated so that the face is oriented in a locked position, and an unlocked state, wherein the face is rotated so that the face is oriented in an unlocked position; and
   an actuator operably coupled to the at least one projection and the actuator movable along a first plane imparting an in-line lateral motion between a first position and a second position whereby in the first position the at least one projection is rotated to the locked state and in the second position the at least one projection is rotated to the unlocked state.

2. The releasable locking mechanism of claim 1 wherein the projection has a non-circular cross-section.

3. The releasable locking mechanism of claim 1 wherein the at least one projection includes an engagement face and a sliding face.

4. The releasable locking mechanism of claim 3 wherein the engagement face is oriented at a terminal end of the projection adjacent the sliding face and the engagement face is offset from the sliding face by approximately 90°.

5. The releasable locking mechanism of claim 3 wherein the at least one projection extends along a longitudinal axis, the engagement face is parallel to the longitudinal axis and the sliding face is skewed from the longitudinal axis.

6. The releasable locking mechanism of claim 1 wherein the carrier includes an exterior surface such that the at least one projection can extend from the exterior surface and retract at least partially within the exterior surface.

7. The releasable locking mechanism of claim 6 wherein the at least one projection can rotate between a locked state and an unlocked state and through an intermediate state, the at least one projection capable of retracting at least partially within the exterior surface in the locked and unlocked states and cannot be retracted in the intermediate state.

8. The releasable locking mechanism of claim 7 wherein the at least one projection includes a retraction lock to prevent the projection from retracting within the exterior surface while in the intermediate state.

9. The releasable locking mechanism of claim 1 further comprising two projections, each biased towards the locked state.

10. The releasable locking mechanism of claim 1 wherein the at least one projection includes a tab extending therefrom and the actuator includes an aperture operably coupled to the tab to rotate the at least one projection.

11. A releasable locking mechanism and assembly comprising: a carrier;
    a receptacle sized to receive at least a portion of the carrier;
    an engagement surface located on one of the carrier and the receptacle; and
    at least one projection extending from the other of the carrier and the receptacle, the at least one projection having an engagement face and a sliding face, the engagement face engaging the engagement surface in a locked state thereby retaining the carrier relative to the receptacle, the sliding face engaging the engagement surface in an unlocked state thereby permitting the carrier to be removed from the receptacle, the at least one projection rotatable between the locked state and the unlocked state so that rotation of the projection causes the engagement face to rotate out of engagement with the engagement surface.

12. The releasable locking mechanism and assembly of claim 11 wherein the engagement face is oriented at a terminal end of the projection adjacent the sliding face and the engagement face is offset from the sliding face by approximately 90°.

13. The releasable locking mechanism and assembly of claim 11 wherein the at least one projection extends along a longitudinal axis, the engagement face is parallel to the longitudinal axis and the sliding face is skewed from the longitudinal axis.

14. The releasable locking mechanism and assembly of claim 11 wherein the at least one projection can rotate between a locked state and an unlocked state and through an intermediate state, the at least one projection capable of being at least partially retracted in the locked and unlocked states and cannot be retracted in the intermediate state.

15. The releasable locking mechanism and assembly of claim 14 wherein the at least one projection includes a retraction lock to prevent the projection from retracting while in the intermediate state.

16. The releasable locking mechanism and assembly of claim 11 further comprising two projections, each biased towards the locked state.

17. The releasable locking mechanism and assembly of claim 11 further comprising an actuator having an aperture and the at least one projection includes a tab extending therefrom, the aperture being operably coupled to the tab to rotate the at least one projection.

18. A releasable fastener and assembly comprising:
    a carrier;
    a receptacle sized to receive at least a portion of the carrier when the carrier is inserted within the receptacle in a lateral direction;
    an engagement surface located on one of the carrier and the receptacle;
    at least one projection extending from the other of the carrier and the receptacle, the at least one projection being rotatable along a rotational axis between a locked state thereby retaining the carrier relative to the receptacle and an unlocked state thereby permitting the carrier to be removed from the receptacle; and
    an actuator operably coupled to the at least one projection and the actuator is movable in the lateral direction between a first position and a second position whereby in the first position the at least one projection is rotated to the locked state and in the second position the at least one projection is rotated to the unlocked state, the lateral direction being substantially perpendicular to the rotational axis.

19. The releasable fastener and assembly of claim 18 wherein the at least one projection includes a terminal end having a non-circular cross-section and an engagement face and a sliding face.

20. The releasable fastener and assembly of claim 19 wherein the engagement face is oriented at a terminal end of the projection adjacent the sliding face and the engagement face is offset from the sliding face by approximately 90°.

21. The releasable fastener and assembly of claim 18 wherein the at least one projection extends along a longitudinal axis, the engagement face is parallel to the longitudinal axis and the sliding face is skewed from the longitudinal axis.

22. The releasable fastener and assembly of claim 18 wherein the at least one projection can rotate between a locked state and an unlocked state and through an intermediate state, the at least one projection capable of being at least partially retracted in the locked and unlocked states and cannot be retracted in the intermediate state.

23. The releasable fastener and assembly of claim 22 wherein the at least one projection includes a retraction lock to prevent the projection from retracting while in the intermediate state.

24. The releasable fastener and assembly of claim 18 further comprising two projections, each biased towards the locked state.

25. The releasable fastener and assembly of claim 18 wherein the at least one projection includes a tab extending therefrom and the actuator includes an aperture operably coupled to the tab to rotate the at least one projection and translate lateral motion of the actuator to rotating motion of the projection.

* * * * *